(12) United States Patent
Fukui et al.

(10) Patent No.: US 11,248,311 B2
(45) Date of Patent: Feb. 15, 2022

(54) SAPPHIRE RIBBON AND APPARATUS FOR MANUFACTURING SINGLE CRYSTAL RIBBONS

(71) Applicant: KYOCERA Corporation, Kyoto (JP)

(72) Inventors: Akeo Fukui, Higashiomi (JP); Keigo Hoshikawa, Nagano (JP)

(73) Assignee: KYOCERA Corporation, Kyoto (JP)

( * ) Notice: Subject to any disclaimer, the term of this patent is extended or adjusted under 35 U.S.C. 154(b) by 32 days.

(21) Appl. No.: 16/826,896

(22) Filed: Mar. 23, 2020

(65) Prior Publication Data

US 2020/0308726 A1 Oct. 1, 2020

Related U.S. Application Data

(60) Provisional application No. 62/823,077, filed on Mar. 25, 2019.

(51) Int. Cl.
| | | |
|---|---|---|
| *C30B 15/34* | (2006.01) | |
| *C30B 29/64* | (2006.01) | |
| *C30B 35/00* | (2006.01) | |
| *C30B 29/20* | (2006.01) | |

(52) U.S. Cl.
CPC .............. *C30B 29/64* (2013.01); *C30B 15/34* (2013.01); *C30B 29/20* (2013.01); *C30B 35/002* (2013.01); *C30B 35/007* (2013.01)

(58) Field of Classification Search
CPC ......... C30B 15/34; C30B 29/64; C30B 29/20; Y10T 117/903
See application file for complete search history.

(56) References Cited

U.S. PATENT DOCUMENTS

| 4,443,411 | A | * | 4/1984 | Kalejs | ..................... C30B 15/20 117/211 |
| 7,682,452 | B2 | * | 3/2010 | Outwater | ................ C30B 15/34 117/209 |
| 9,551,089 | B2 | * | 1/2017 | Ouellette | ................ C30B 29/20 |
| 2014/0083353 | A1 | * | 3/2014 | Pope | ...................... C30B 15/34 117/211 |
| 2014/0311402 | A1 | * | 10/2014 | Ouellette | ................ C30B 15/34 117/26 |
| 2017/0226659 | A1 | * | 8/2017 | Tatartchenko | ........ C30B 15/206 |

FOREIGN PATENT DOCUMENTS

| JP | 2007-532458 A | 11/2007 |
| JP | 2015-124096 A | 7/2015 |
| WO | 2005/100646 A1 | 10/2005 |

* cited by examiner

*Primary Examiner* — Robert M Kunemund
(74) *Attorney, Agent, or Firm* — Procopio Cory Hargreaves and Savitch LLP

(57) ABSTRACT

A sapphire ribbon of the present disclosure has a width, a thickness, and a length that are orthogonal to one another, a length direction is a growth direction, and the sapphire ribbon further has two main surfaces separate from each other in a thickness direction, and the width is at least 40 cm. Further, a monocrystalline ribbon manufacturing apparatus using EFG method according to the present disclosure includes a crucible having a width greater than a depth thereof, a die pair installed in the crucible and facing each other across a slit in the depth direction, a first heater and a second heater disposed around the crucible and facing each other in the depth direction, and a third heater and a fourth heater disposed around the crucible and facing each other in the width direction.

9 Claims, 4 Drawing Sheets

SAPPHIRE RIBBON AND APPARATUS FOR MANUFACTURING SINGLE CRYSTAL RIBBONS

This application claims the benefit of domestic priority under 35 USC 119(e) based on provisional application No. 62/823,077 filed on Mar. 25, 2019, the contents of which is incorporated by reference in their entireties.

BACKGROUND OF THE INVENTION

The present disclosure relates to a sapphire ribbon manufactured using EFG method and a monocrystalline ribbon manufacturing apparatus using the EFG method.

A manufacturing apparatus (an EFG apparatus) using Edge-Defined Film-Fed Growth (EFG) method is used as an apparatus for manufacturing a ribbon-like monocrystalline body.

In an EFG apparatus 10, as conceptually illustrated in FIG. 2, a die pair 3 that face each other across a slit are installed in a crucible 1. A raw material of a monocrystalline body filled in the crucible 1 is heated and melted by heating means 4 disposed around the outer periphery of the crucible 1. A resulting melt 5 rises in the slit as far as upper surfaces of the die pair 3 by capillary phenomenon. A seed crystal 6 is brought into contact with a liquid surface of the melt 5 and being pulled upward while being annealed, whereby a monocrystalline body (ribbon) 11 is grown. The shape of the horizontal cross-section of the ribbon 11 is determined by the shape of the top surface of the die pair 3.

In recent years, large sapphire ribbons are required for cutting out large substrates in applications such as window members for semiconductor manufacturing equipment. Patent Document 1 describes an EFG apparatus for growing a sapphire ribbon having a width of 305 mm, and Patent Document 2 describes an EFG apparatus for growing a sapphire ribbon having a width of 8 inches to 12 inches.

As for growth conditions in the EFG method, control of temperature distribution at and near the die pair is important. However, the larger the monocrystal that is growing, the more difficult it is to control the temperature distribution, and this makes it difficult to obtain a high quality monocrystal.

SUMMARY OF INVENTION

A sapphire ribbon of the present disclosure has a width, a thickness, and a length that are orthogonal to each other, a length direction is a growth direction, the sapphire ribbon further has two main surfaces separate from each other in a thickness direction, and the width is 40 cm or more.

A monocrystalline ribbon manufacturing apparatus using EFG method according to the present disclosure includes a crucible having a width greater than a depth thereof, a die pair installed in the crucible and facing each other across a slit in a depth direction, a first heater and a second heater disposed around the crucible and facing each other in the depth direction, and a third heater and a fourth heater disposed around the crucible and facing each other in the width direction.

DESCRIPTION OF EMBODIMENTS

Figure 1:
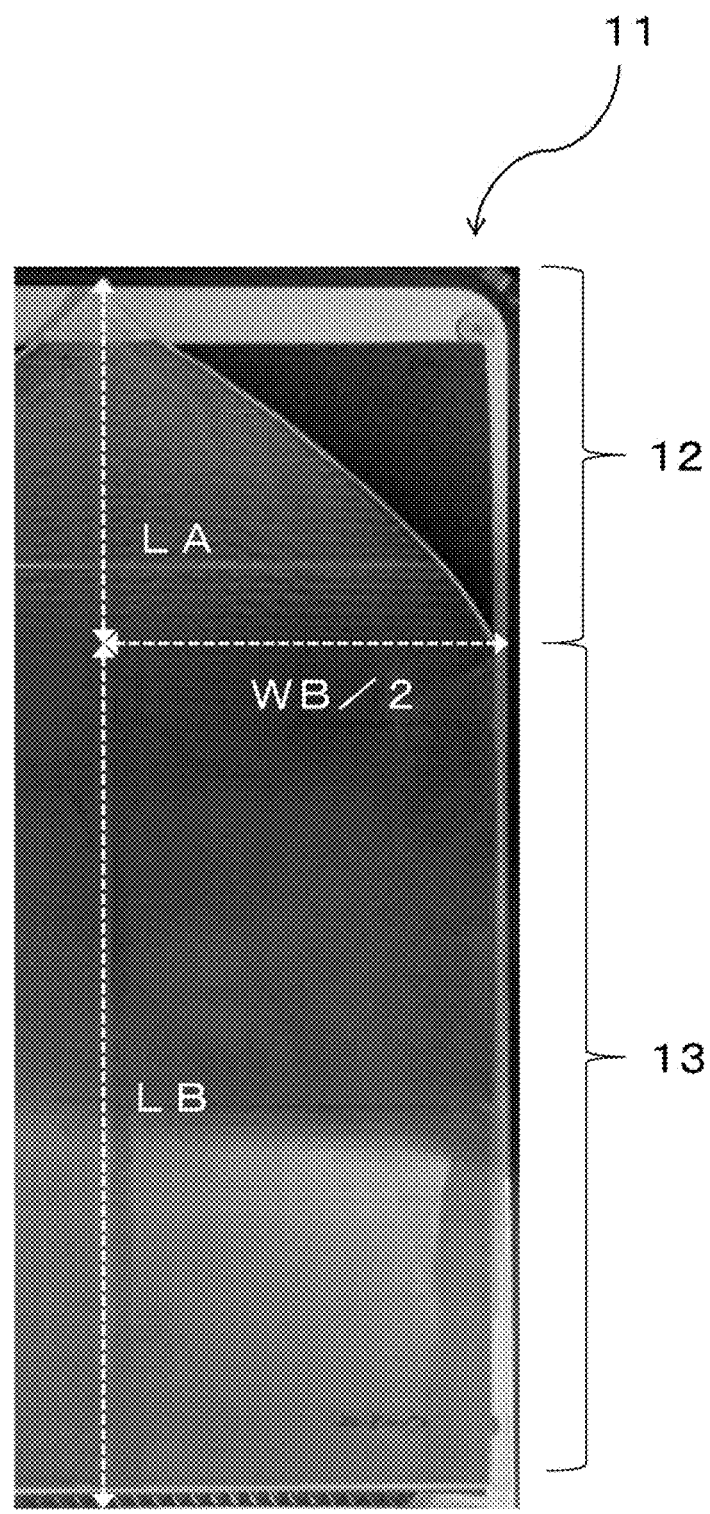
FIG. 1 is a photograph of an outer appearance of a sapphire ribbon according to the present disclosure.

A sapphire ribbon 11 according to the present disclosure will be described with reference to the drawings. Note that sapphire refers to monocrystal alumina (chemical formula $Al_2O_3$). FIG. 1 is a photograph of the outer appearance of the sapphire ribbon 11. The sapphire ribbon 11 has a width, a thickness, and a length. A width direction, a thickness direction, and a length direction are orthogonal to one another, and a growth direction (a pulling up direction) of the sapphire ribbon 11 is the length direction. Of the directions orthogonal to the length direction, a larger of the dimensions (the width and thickness) is referred to as the width direction, and a smaller of the dimensions is the thickness direction. In addition, two large surfaces separate from each other in the thickness direction are referred to as "main surfaces," and two surfaces that are separate from each other in the width direction and that connect the main surfaces to each other are referred to as "side surfaces."

The width of the sapphire ribbon 11 according to the present disclosure is 400 mm or more, and is, for example, from 400 mm to 600 mm. The thickness is, for example, from 5 mm to 40 mm.

The sapphire ribbon 11 includes a spread portion 12 and a body portion 13. The spread portion 12 is a portion at which the width of the sapphire ribbon 11 expands during a process of growth thereof. The body portion 13 is a section having a substantially constant width. The length of the body portion 13 is 400 mm or more, for example, and is more preferably 500 mm or more. Further, the sapphire ribbon 11 may have a tail portion (not illustrated) that is a portion which is continuous to the body portion 13 and at which the width of the sapphire ribbon 11 decreases during the process of growth thereof.

The width of the spread portion 12 increases from the width of a seed crystal 6 to the width of the body portion 13. A maximum width of the spread portion 12, that is, the width of the body portion 13, is WB. Of lengths of both side surfaces of the spread portion 12, the longer length is a length LA of the spread portion 12. When the upper end of the spread portion (the lower end of the seed crystal 6) is an origin point (0, 0), coordinates in the length direction of the sapphire ribbon 11 are denoted by L, and the width at the coordinates L is denoted by W. The coordinates on both sides of the lower end of the spread portion (the upper end of the body portion) are (LA, ±WB/2).

An angle that is formed between a tangent of the side surface of the spread portion 12 at the coordinate L, and the length direction (an L axis direction) is assumed to be θ. 2θ is assumed to be a spread angle at a position L. Further, an inclination (hereinafter simply referred to as an "inclination") of the side surface of the spread portion 12 with respect to the length direction (the L axis direction), in a range (0≤L≤LA, for example) of a certain specific region, is defined using an inclination calculated using the least squares method from a curve obtained by plotting L and W/2.

The inclination of the spread portion 12 (the inclination in the range 0≤L≤LA) is preferably from 0.9 to 2.0. If the inclination of the spread portion 12 is 0.9 or more, the spread portion 12 can be shortened, and thus the sapphire ribbon 11 having the relatively long body portion 13 can be obtained.

Since the spread portion 12 does not have sufficient width to be used as a product, it is preferable for the sapphire ribbon 11 to have the relatively long body portion 13. Further, the shorter the entire length of the sapphire ribbon 11, the more it is possible to suppress an increase in crystal defects, and this is favorable also from the perspective of productivity. If the inclination of the spread portion 12 is 2.0 or less, the high-quality sapphire ribbon 11 having fewer crystal defects can be provided. The quality of the sapphire ribbon 11 can be expressed by the presence or absence of crystal grain boundaries, dislocation density, lineage density, and the like.

In the spread portion 12, a region of $0 \leq L \leq 30$ mm is a first region, a region of 30 mm$\leq L$, $W \leq 0.9 WB$ is a second region, and a region of $0.9 WB \leq W \leq WB$ is a third region. Note that if the width WB of the sapphire ribbon 11 is 400 mm or more, the length of the first region is 30 mm, regardless of the width WB of the body portion 13.

The inclination of the first region, which is at an initial stage of growth, is preferably from 0.5 to 1.5. When the inclination of the first region is 0.5 or more, the spread portion 12 can be shortened. If the inclination of the first region is 1.5 or less, the high-quality sapphire ribbon 11 having fewer crystal defects can be provided.

The second region is a main portion that configures the spread portion 12. The inclination of the second region is preferably from 0.8 to 2.0. If the inclination is 0.8 or more, the spread portion 12 can be shortened. If an inclination F is 2.0 or less, the high-quality sapphire ribbon 11 having fewer crystal defects (dislocation, lineage, crystal grain boundaries, etc.) can be provided.

When the inclination of the first region is relatively larger (more rapidly expands) than the inclination of the second region, bending of the crystals, which is caused by the lower end of the growing sapphire ribbon 11 coming into contact with the die pair 3, is less likely to occur. Specifically, if a relationship between an inclination a1 of the first region and an inclination a2 of the second region is $a2 > 1.19 \times a1 - 0.01$, bending is less likely to occur. If bending occurs, fluctuations in the thickness of the sapphire ribbon 11 increase, and therefore, when the sapphire ribbon 11 is grown under conditions in which bending is likely to occur, it is necessary to increase the thickness of the sapphire ribbon 11, that is, to increase a machining margin, and thus manufacturing costs and machining time increase.

Further, in the first region, L and W/2 (that is, the side surface shape) can be approximated using a logarithmic function ($W/2 = a \log L + b$). In the second region, L and W/2 (that is, the side surface shape) can be approximated using an exponential function ($W/2 = aL^b$). Here, the approximation being able to be implemented using the logarithmic function signifies that a correlation coefficient of the logarithmic approximation is larger than a correlation coefficient of the exponential approximation, and the approximation being able to be implemented using the exponential function signifies that the correlation coefficient of the exponential approximation is greater than the correlation coefficient of the logarithmic approximation. In this way, by controlling the spread shape of the first region and the second region, the sapphire ribbon 11 having favorable quality and the shorter spread portion 12 can be obtained.

In the vicinity of a connecting portion between the third region and the body portion 13, due to changes in growth conditions as a result of the sapphire ribbon 11, which has grown in the width direction and the length direction, growing only in the length direction, crystal defects (dislocation, lineage, crystal grain boundaries, and the like) are more likely to occur. Therefore, in the third region, an upper limit on the inclination of the spread portion 12 is preferably smaller than that in the second region. Specifically, the inclination of the third region (the inclination in the region $0.9 WB \leq W \leq WB$) is preferably from 0.3 to 1.8. When the inclination of the third region is 0.3 or more, the spread portion 12 can be shortened. When the inclination of the third region is 1.8 or less, the high-quality sapphire ribbon 11 having fewer crystal defects can be provided.

Lineage, which is one of the crystal defects of the sapphire ribbon 11, is likely to grow in a c axis direction. Therefore, when the length direction, which is the growth direction, is close to the c axis, the lineage may more likely occur. Conversely, when the length direction is far from the c axis, the lineage grows in a direction extending to the outside of the crystal, and therefore, the lineage may less likely occur. Further, when the main surface of the sapphire ribbon 11 is an a-plane, the strength is highest and cracking is unlikely to occur. When the main surface is the a-plane, the length direction is furthest from the c axis in a case in which the length direction is an m axis direction. Thus, in the sapphire ribbon 11, the main surface is preferably close to the a-plane (the inclination from the a-plane is within 15°) and the length direction is close to the m axis (the inclination from the m axis is within 15°).

With an EFG apparatus of the related art, it is difficult to grow the high quality large sapphire ribbon 11 in this way. Since the EFG apparatus according to the present disclosure is provided with four independent heaters 4, to the front and back and left and right around the crucible 1, as described below, the high-quality large sapphire ribbon 11 can be grown.

Figure 2:
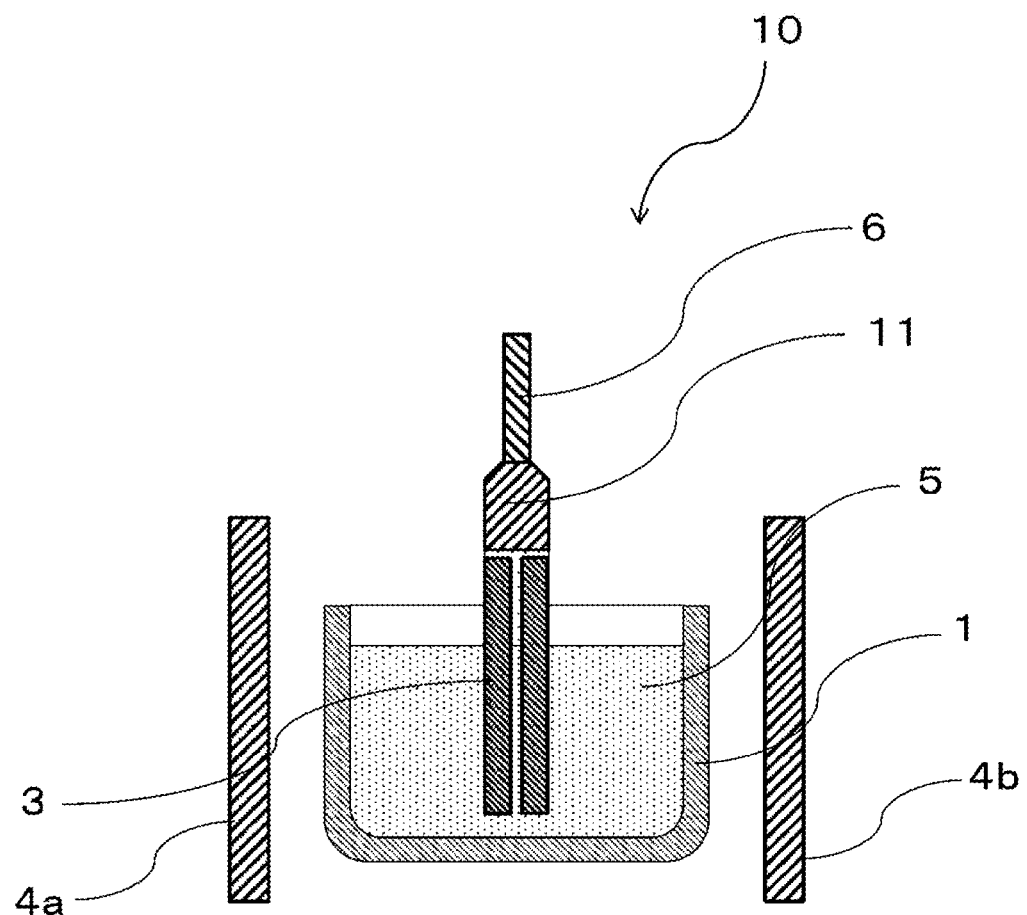
FIG. 2 is a schematic diagram of an EFG apparatus according to the present disclosure.
Figure 3:
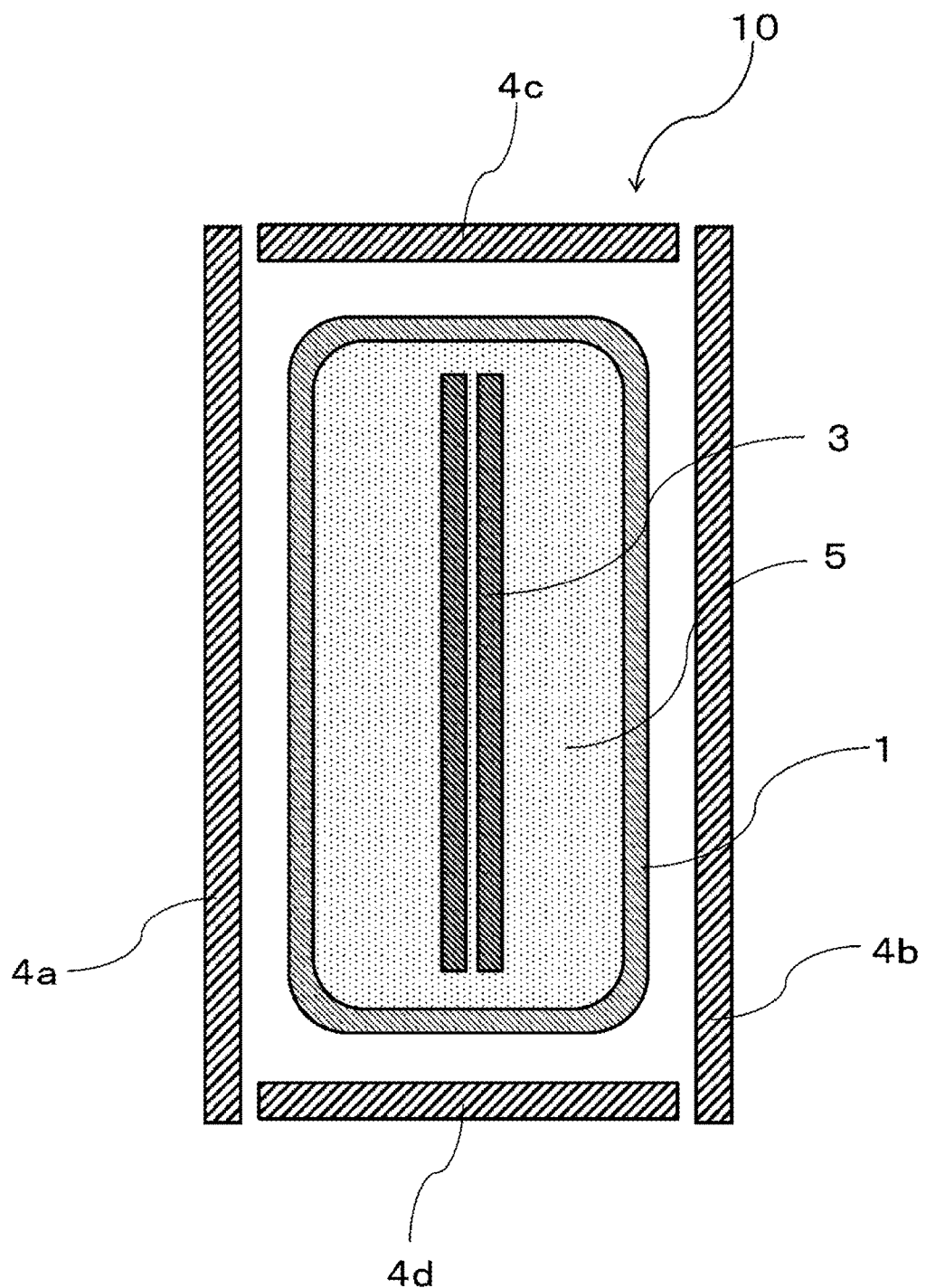
FIG. 3 is a schematic diagram of the EFG apparatus according to the present disclosure.
Figure 4:
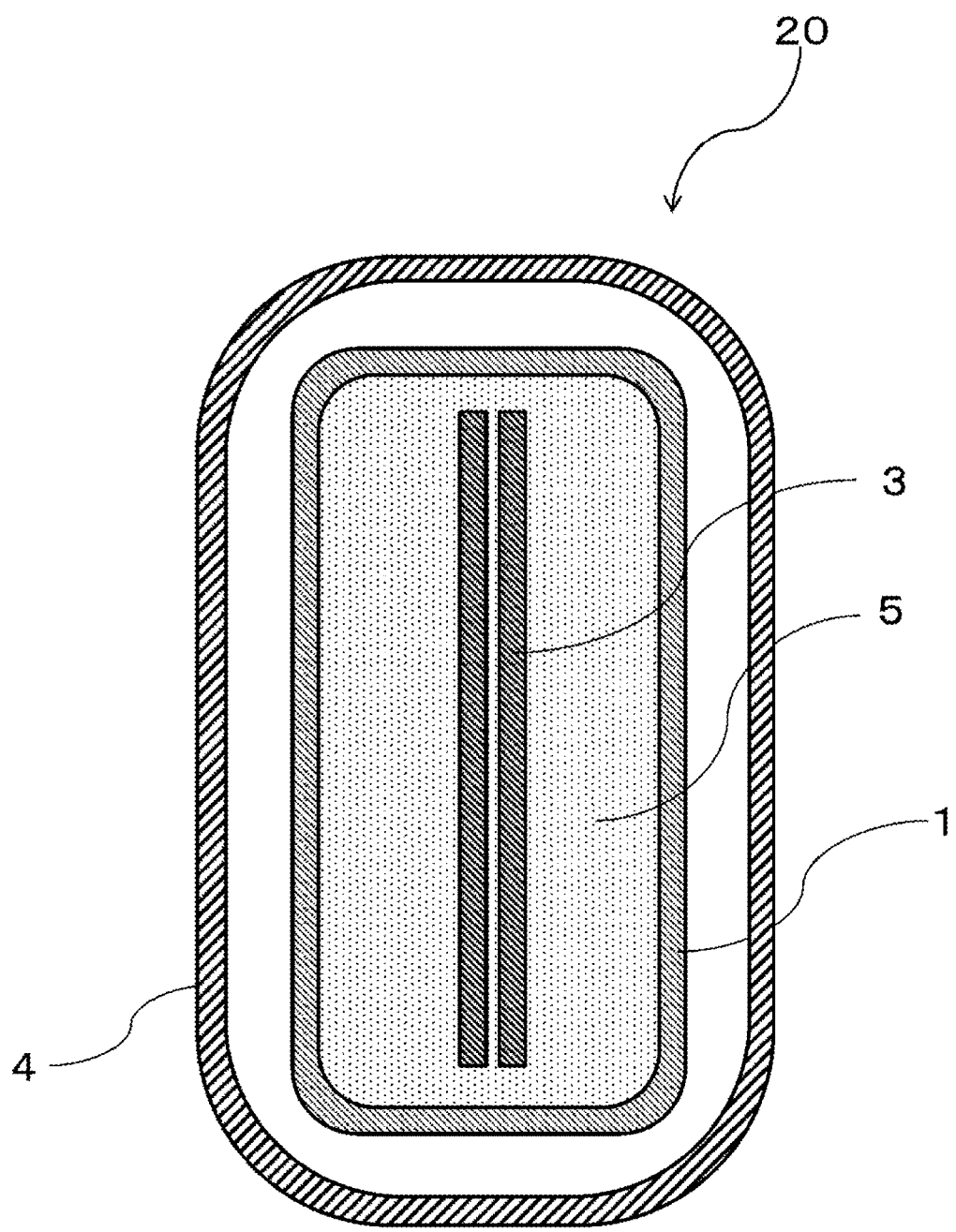
FIG. 4 is a schematic view of an EFG apparatus of the related art.

Hereinafter, an EFG-method monocrystal-ribbon manufacturing apparatus (EFG apparatus) according to the present disclosure will be described with reference to the drawings. FIG. 2 and FIG. 3 are schematic diagrams of an EFG apparatus 10 according to the present disclosure, where FIG. 2 is a vertical cross-sectional view, and FIG. 3 is a horizontal cross-sectional view. FIG. 4 is a schematic view (a horizontal cross-sectional view) of an EFG apparatus 20 of related art.

In the EFG apparatus 10 and 20, the die pair 3 that face each other across a slit are installed in a crucible 1. A raw material (alumina in a case where the sapphire ribbon 11 is grown) filled in the crucible 1 is heated and melted by heating means 4 disposed around the crucible 1. A resulting melt 5 rises as far as upper surfaces of the die pair 3 as a result of a capillary phenomenon in the slit. The seed crystal 6 is brought into contact with the liquid surface of the melt 5, and the ribbon 11 is grown by annealing the seed crystal 6 while pulling the seed crystal 6 upward. A reference sign 7 denotes a solid-liquid interface between the melt 5 and the ribbon 11. The shape (the width and thickness) of the horizontal cross section of the ribbon 11 is determined by the shape of the upper surfaces of the die pair 3.

The heating means 4 of the EFG apparatus 20 in the related art is a coil for high frequency heating or is a resistance heating type heater, and has an annular shape, as illustrated in FIG. 4. In the EFG apparatus 20 of the related art a temperature distribution in the melt 5 and the die pair 3 may be varied depending on a distance from the heating means 4. For example, the temperature is low in the vicinity of the center of the die pair 3 in the width direction, and the temperature is high near the ends thereof. In addition, when there is displacement between center positions of the crucible 1, the die pair 3, and the heating means 4 in the EFG apparatus 20, the melt 5 and the die pair 3 may exhibit varied temperature distribution. This type of temperature distribution may cause shape defects and deterioration in crystal quality of the ribbon 11 that is to be grown. However, in the EFG apparatus 20 of the related art, temperature adjustment to eliminate such temperature distribution has been difficult.

The horizontal cross section of the crucible 1 of the EFG apparatus 10 according to the present disclosure has a shape in which lengths in a width direction and in a depth direction thereof are different from each other, as represented by a rectangular shape or an oval shape. The width direction of the crucible 1 matches the width direction of the ribbon 11, and the depth direction of the crucible 1 matches the thickness direction of the ribbon 11. In other words, the width of the crucible 1 is greater than the depth thereof. As a result, the cross-sectional area and the volume of the crucible 1 and the melt 5 can be reduced, and the distance between the heating means 4 and the crucible 1, the melt 5, and the die pair 3 can be reduced, thus the temperature and temperature distribution of the melt 5 and the die pair 3 can be more easily adjusted. A ratio of the width to the depth of the crucible 1 is, for example, 1.5:1 or more, and is preferably 2:1 or more.

The shape of the upper surface, on which the melt accumulates, of the die pair 3 is designed to conform to the width and thickness of the growing ribbon 11. The width of the upper surface of each of the die pair 3 is, for example, 400 mm or more, and is, for example, from 400 mm to 500 mm. The die pair 3 face each other in the thickness direction across the slit, and, when viewed from the upper surface, the slit extends in the width direction.

The heating means 4 includes a first heater 4a and a second heater 4b that are disposed facing each other in the depth direction of the crucible 1 around thereof, and a third heater 4c and a fourth heater 4d facing each other in the width direction around the crucible 1. The first heater 4a, the second heater 4b, the third heater 4c, and the fourth heater 4d are each independently temperature-controlled. Electrode terminals for supplying an electrical current to the heating means 4 may be provided independently for each of the heaters 4a to 4d, or may be provided to be shared with the adjacent heaters 4a to 4d. The first heater 4a and the second heater 4b are disposed so as to be substantially parallel to the die pair 3 (the ribbon 11), and the third heater 4c and the fourth heater 4d are disposed so as to be substantially perpendicular to the die pair 3 (the ribbon 11).

The crucible 1 and the die pair 3 are housed in a space enclosed by the four heating means 4. In other words, the width between the first heater 4a and the second heater 4b is greater than the width of the crucible 1. The width (in the thickness direction of the ribbon 11) between the third heater 4c and the fourth heater 4d is greater than the depth of the crucible 1.

With the above configuration, the temperature and temperature distribution of the melt 5 and the die pair 3 can be more easily adjusted. With the EFG apparatus 10 according to the present disclosure, the high quality large ribbon 11 can be provided. In addition, since the temperature control by the first heater 4a, the second heater 4b, the third heater 4c, and the fourth heater 4d can be independently implemented, it is easy to adjust the temperature distribution in the width direction and the thickness direction during the growth of the ribbon 11. In particular, the temperature adjustment at both ends of the die pair 3 in the width direction is made easier by the third heater 4c and the fourth heater 4d, and this makes it easier to adjust the width W and the spread angle 2θ of the spread portion 12, thereby facilitating formation of the spread portion 12 having a desired shape. Similarly, formation of a tail having a desired shape is facilitated.

A preferred embodiment of the present disclosure has been described above, but the present disclosure is not limited to the embodiment described above, and various modifications and changes can be made within the scope of the description of the claims.

EXAMPLES

Using the EFG apparatus 10 of the present disclosure, growth of the sapphire ribbon 11 having a width of 420 mm and a thickness of 8.5 mm, with the a-plane being a main surface and the m axis being a pulling direction (the length direction), was performed a plurality of times. The width of each of the die pair 3 is 420 mm and the thickness thereof is 8.5 mm. The width between the first heater 4a and the second heater 4b is larger than the width of the die pair 3 and the sapphire ribbon 11, and the length between the third heater 4c and the fourth heater 4d in the depth direction is larger than the thickness of the die pair 3 and the sapphire ribbon 11. The horizontal direction cross section of the seed crystal 6 has a rectangular shape, the main surface of the seed crystal 6 is the a-plane, and the pulling direction is the m axis.

Using a pulling rate under a same (constant) condition, seven of the sapphire ribbons 11 of different shapes of the spread portion 12 were grown under conditions 1 to 7, with the output of the heating means 4a to 4b being adjusted while pulling. The width WB of the body portion 13 of each ribbon is 420 mm. Table 1 shoes the inclination (WB/2LA) of the spread portion 12, the inclinations of the first region, the second region, and the third region (a1, a2, and a3) and the value of $1.19 \times a1 - 0.01$, a square of a correlation coefficient R ($R^2$) of each of logarithmic approximation and exponential approximation of the first region and the second region, and ribbon quality.

TABLE 1

| | | Coefficient of approximation curve | | | | Correlation coefficient R^2 | | | | |
| | | First | Second | Third | 1.19 × | First region | | Second region | | Results |
| Sample No. | Inclination Entirety WB/2LA | region a1 | region a2 | region a3 | a1 − 0.01 | Logarithmic function | Exponential function | Logarithmic function | Exponential function | Ribbon quality |
|---|---|---|---|---|---|---|---|---|---|---|
| 1 | 0.90 | 0.68 | 0.84 | 0.77 | 0.80 | 0.92 | 0.85 | 0.95 | 0.97 | Excellent |
| 2 | 1.92 | 1.40 | 1.91 | 0.91 | 1.65 | 0.95 | 0.82 | 0.95 | 1.00 | Excellent |
| 3 | 1.10 | 0.53 | 1.16 | 0.86 | 0.62 | 0.97 | 0.79 | 0.94 | 0.99 | Excellent |
| 4 | 1.03 | 1.46 | 1.06 | 0.47 | 1.73 | 0.90 | 0.89 | 0.96 | 0.99 | Good |
| 5 | 1.10 | 1.04 | 1.15 | 0.55 | 1.23 | 0.92 | 0.85 | 0.94 | 0.99 | Good |
| 6 | 0.83 | 1.88 | 1.88 | 0.23 | 2.23 | 0.83 | 0.94 | 0.92 | 1.00 | Marginal |
| 7 | 0.63 | 1.19 | 0.62 | 0.28 | 1.41 | 0.91 | 0.90 | 0.90 | 1.00 | Marginal |

Under conditions 1 to 3, the favorable quality ribbon 11 with fewer crystal defects was obtained. Conditions 4 and 5 also resulted in the ribbon 11 with fewer crystal defects, but crystal bending was seen. Under conditions 6 and 7, the ribbon 11, in which the inclination of the spread portion 12 was relatively small and the spread portion 12 was relatively long (the body portion 13 was relatively short), was obtained. Condition 6 resulted in a relatively high number of crystal defects, and crystal bending. From the above, by setting the inclination of the spread portion 12 to be from 0.9 to 2.0, the inclination a1 of the first region to be from 0.5 to 1.5, and the inclination a2 of the second region to be from 0.8 to 2.0, it was possible to grow the sapphire ribbon 11, in which the body portion 13 is relatively long, and which has fewer crystal defects (conditions 1 to 5). Furthermore, when the sapphire ribbon 11 is grown such that a2>1.19×a1−0.01 is satisfied, it was possible to grow the sapphire ribbon 11 with fewer crystal defects as well as less bending (conditions 1 to 3). Further, when the sapphire ribbon 11 is grown such that the side surface shape of the first region is the logarithmic approximation and the side surface shape of the second region is the exponential approximation, it was possible to grow the sapphire ribbon 11 with fewer crystal defects (conditions 1 to 5 and 7).

REFERENCE SIGNS LIST

1 Crucible
3 Die pair
4 Heating means
4a First heater
4b Second heater
4c Third heater
4d Fourth heater
5 Melt
6 Seed crystal
10, 20 EFG Apparatus
11, 21 Sapphire ribbon (ribbon, monocrystalline body)
12 Spread portion
13 Body portion

What is claimed is:

1. A sapphire ribbon comprising a width, a thickness, and a length orthogonal to one another, wherein
a length direction is a growth direction,
the sapphire ribbon further comprising two main surfaces separate from each other in a thickness direction, and the width being at least 40 cm,
the sapphire ribbon further comprising a spread portion and a body portion, and two side surfaces separate from each other in a width direction and connecting the main surfaces, wherein
an inclination of each of the side surfaces with respect to a length direction of the spread portion (defined as WB/2LA, where WB is a width of the body portion and LA is a length of the spread portion) is from 0.9 to 2.0.

2. The sapphire ribbon according to claim 1, wherein when, with respect to coordinates L of a length direction and coordinates W of a width direction of the spread portion, a region of $0 \leq L \leq 30$ mm is a first region, a region of $30$ mm$\leq L$, $W \leq 0.9$ WB is a second region, and a region of $0.9$ WB$\leq W \leq$WB is a third region, an inclination a1 of a linear approximation (W/2=aL+b) of the first region is from 0.5 to 1.5, and an inclination a2 of a linear approximation of the second region is from 0.8 to 2.0.

3. The sapphire ribbon according to claim 2, wherein a2>1.19×a1−0.01.

4. The sapphire ribbon according to claim 1, wherein in the first region a correlation coefficient of a logarithmic approximation (W/2=a log L+b) is larger than a correlation coefficient of an exponential approximation (W/2=aL$^b$), and in the second region, a correlation coefficient of an exponential approximation is larger than a correlation coefficient of a logarithmic approximation.

5. The sapphire ribbon according to claim 1, wherein an inclination of the main surface from an a-plane is within 15° and an inclination from an m axis in the length direction is within 15°.

6. A monocrystalline ribbon manufacturing apparatus using EFG method, the apparatus comprising:
a crucible having a width greater than a depth thereof in a plan view;
a die pair installed in the crucible and facing each other across a slit in a depth direction, each die having at least a front, back, left, and right surface;
a rectangular first heater and a rectangular second heater disposed around the crucible and facing each other in the depth direction; and
a rectangular third heater and a rectangular fourth heater disposed around the crucible and facing each other in the width direction,
wherein each of the first, second third and fourth heaters are substantially parallel to the front, back, left, and right surfaces of each die.

7. The monocrystalline ribbon manufacturing apparatus according to claim 6, wherein the first heater, the second heater, the third heater, and the fourth heater are each independently temperature-controlled.

8. The monocrystalline ribbon manufacturing apparatus according to claim 6, wherein the first heater and the second heater are disposed substantially parallel to the die pair, and the third heater and the fourth heater are disposed substantially perpendicular to the die pair.

9. The monocrystalline ribbon manufacturing apparatus according to claim 6, wherein a width between the first heater and the second heater is greater than the width of the crucible, and a width between the third heater and the fourth heater in a depth direction is greater than the depth of the crucible.

* * * * *